United States Patent
Vincent et al.

(10) Patent No.: US 9,476,143 B2
(45) Date of Patent: Oct. 25, 2016

(54) METHODS USING MASK STRUCTURES FOR SUBSTANTIALLY DEFECT-FREE EPITAXIAL GROWTH

(71) Applicant: IMEC, Leuven (BE)

(72) Inventors: Benjamin Vincent, Elsene (BE); Voon Yew Thean, Brussels (BE); Liesbeth Witters, Everberg (BE)

(73) Assignee: IMEC, Leuven (BE)

( * ) Notice: Subject to any disclaimer, the term of this patent is extended or adjusted under 35 U.S.C. 154(b) by 538 days.

(21) Appl. No.: 13/768,462

(22) Filed: Feb. 15, 2013

(65) Prior Publication Data

US 2013/0233238 A1    Sep. 12, 2013

Related U.S. Application Data

(60) Provisional application No. 61/599,120, filed on Feb. 15, 2012.

(51) Int. Cl.
| | |
|---|---|
| *C30B 25/04* | (2006.01) |
| *C30B 23/04* | (2006.01) |
| *H01L 21/02* | (2006.01) |
| *H01L 29/66* | (2006.01) |
| *C30B 19/00* | (2006.01) |

(52) U.S. Cl.
CPC .............. *C30B 23/04* (2013.01); *C30B 19/00* (2013.01); *C30B 25/04* (2013.01); *H01L 21/02381* (2013.01); *H01L 21/02422* (2013.01); *H01L 21/02532* (2013.01); *H01L 21/02538* (2013.01); *H01L 21/02639* (2013.01); *H01L 21/02647* (2013.01); *H01L 21/02664* (2013.01); *H01L 29/66795* (2013.01)

(58) Field of Classification Search
CPC ....... C30B 25/00; C30B 25/02; C30B 25/04; C30B 25/18; C30B 25/183; C30B 25/186; C30B 29/64; C30B 29/68; H01L 21/02104; H01L 21/02107; H01L 21/02109; H01L 21/022; H01L 21/02635; H01L 21/02367; H01L 21/0237; H01L 21/02373; H01L 21/02381; H01L 21/02436; H01L 21/02518; H01L 21/02612; H01L 21/02617; H01L 21/02636; H01L 21/02647; H01L 21/027; H01L 21/033; H01L 21/0334
USPC .............. 117/58, 84, 88–89, 94–95, 97, 101, 117/106, 938, 939
See application file for complete search history.

(56) References Cited

U.S. PATENT DOCUMENTS

| | | | |
|---|---|---|---|
| 8,062,963 B1 | 11/2011 | van Dal | |
| 2007/0267722 A1 | 11/2007 | Lochtefeld et al. | |
| 2008/0073667 A1 | 3/2008 | Lochtefeld | |
| 2010/0216277 A1* | 8/2010 | Fiorenza | H01L 21/02381 438/94 |
| 2011/0101421 A1* | 5/2011 | Xu | H01L 21/02381 257/255 |

FOREIGN PATENT DOCUMENTS

EP    0 951 055 A2 * 10/1999

* cited by examiner

*Primary Examiner* — Kenneth A Bratland, Jr.
(74) *Attorney, Agent, or Firm* — McDonnell Boehnen Hulbert & Berghoff LLP (57) ABSTRACT

Disclosed are methods and mask structures for epitaxially growing substantially defect-free semiconductor material. In some embodiments, the method may comprise providing a substrate comprising a first crystalline material, where the first crystalline material has a first lattice constant; providing a mask structure on the substrate, where the mask structure comprises a first level comprising a first opening extending through the first level (where a bottom of the first opening comprises the substrate), and a second level on top of the first level, where the second level comprises a plurality of second trenches positioned at a non-zero angle with respect to the first opening. The method may further comprise epitaxially growing a second crystalline material on the bottom of the first opening, where the second crystalline material has a second lattice constant different than the first lattice constant and defects in the second crystalline material are trapped in the first opening.

16 Claims, 12 Drawing Sheets

METHODS USING MASK STRUCTURES FOR SUBSTANTIALLY DEFECT-FREE EPITAXIAL GROWTH

CROSS-REFERENCE TO RELATED APPLICATIONS

This application is a non-provisional of U.S. Provisional Patent Application No. 61/599,120 filed Feb. 15, 2012, the contents of which are hereby incorporated by reference.

BACKGROUND

Heteroepitaxial growth of semiconductors usually suffers from strain relaxation dislocations formation due to the difference (mismatch) of lattice parameters. One solution proposed in the literature is the selective growth of semiconductor material in narrow oxide trenches. This technique, called Aspect Ratio Trapping (ART), allows for the trapping of defects at the bottom of the narrow oxide trenches using the sidewalls of the narrow oxide trenches. As a result, the top part of the semiconductor grown in the trench can be relaxed and without (or with reduced) defects. One example of such an ART technique is described in U.S. Patent Application Publication No. 2010/0216277.

SUMMARY

Typical ART techniques work well for narrow and short trenches. However, many applications, including, for example, advanced logic complementary metal-oxide-semiconductor (CMOS) devices and photonics, longer trenches are required. Typical ART techniques do not succeed for such longer trenches.

Disclosed are methods and mask structures that allows for the hetero-epitaxial growth of (substantially) defect-free semiconductor material. In particular, the disclosed methods and mask structures may allow for the production of a (substantially) defect-free first crystalline material on a substrate of a second crystalline material, where the first and second crystalline materials have different lattice constants.

In some embodiments, the method may comprise providing a substrate comprising a first crystalline material, wherein the first crystalline material has a first lattice constant. The method may further comprise providing a mask structure on the substrate, wherein the mask structure comprises a first level comprising a first opening extending through the first level, wherein a bottom of the first opening comprises the substrate, and a second level on top of the first level, wherein the second level comprises a plurality of second trenches positioned at a non-zero angle with respect to the first opening. The method may still further comprise epitaxially growing a second crystalline material on the bottom of the first opening until the second crystalline material covers at least a portion of the plurality of second trenches, wherein the second crystalline material has a second lattice constant different than the first lattice constant, and epitaxially growing the second crystalline material on the bottom of the first opening comprises trapping defects in the second crystalline material in at least one direction in the first opening.

In some embodiments, the non-zero angle comprises substantially 90°.

In some embodiments, the plurality of second trenches comprises two arrays of second trenches separated by the first opening.

In some embodiments, the plurality of second trenches extend continuously across the first opening.

In some embodiments, the first opening comprises a first trench.

In some embodiments, the first opening comprises a plurality of first openings.

In some embodiments, epitaxially growing the second crystalline material until the second crystalline material covers at least a portion of the plurality of second trenches comprises growing the second crystalline material until the second crystalline material overgrows the plurality of second trenches.

In some embodiments, the method further comprises planarizing the second crystalline material.

In some embodiments, the at least one direction in the first opening comprises a direction along a length of the first opening.

In some embodiments, each of the first crystalline material and the second crystalline material comprises a semiconductor material.

In some embodiments, the mask structure may comprise a first level comprising a first opening extending through the first level, wherein a bottom of the first opening comprises the substrate, and a second level on top of the first level, wherein the second level comprises a plurality of second trenches positioned at a non-zero angle with respect to the first opening. The mask structure may be configured for epitaxial growth of a second crystalline material on the bottom of the first opening until the second crystalline material covers at least a portion of the plurality of second trenches.

In some embodiments, the first opening has a height that is at least three times a width of the first opening.

In some embodiments, the plurality of second trenches comprises an array of second trenches, and the array is positioned at a non-zero angle with respect to the first opening.

In other embodiments, the method may comprise providing a substrate comprising a first crystalline material, wherein the first crystalline material has a first lattice constant, and providing a mask structure on the substrate, wherein the mask structure comprises a first level comprising a first opening extending through the first level, wherein a bottom of the first opening comprises the substrate, and a second level on top of the first level, wherein the second level comprises two barriers positioned on opposite sides of the first opening. The method may further comprise epitaxially growing a second crystalline material on the bottom of the first opening until the second crystalline material covers at least a portion of the two barriers, wherein the second crystalline material has a second lattice constant different than the first lattice constant, and epitaxially growing the second crystalline material on the bottom of the first opening comprises trapping defects in the second crystalline material in at least one direction in the first opening.

In some embodiments, the first level further comprises an array of first openings including the first opening, and the second level further comprises an array of barriers including the two barriers, wherein barriers in the array of barriers are positioned on opposite sides of first openings in the array of first openings.

In some embodiments, epitaxially growing the second crystalline material until the second crystalline material covers at least a portion of the two barriers comprises growing the second crystalline material until the second crystalline material overgrows the two barriers. In these embodiments, the method may further comprise planarizing the second crystalline material.

In some embodiments, the mask structure may comprise a first level comprising a first opening extending through the first level, wherein a bottom of the first opening comprises the substrate, and a second level on top of the first level, wherein the second level comprises two barriers positioned on opposite sides of the first opening, wherein the mask structure is configured for epitaxial growth of a second crystalline material on the bottom of the first opening until the second crystalline material covers at least a portion of the barriers.

In some embodiments, the first opening has a height that is at least three times a width of the first opening.

In some embodiments, the second level further comprises two additional barriers positioned on additional opposite sides of the first opening such that the two barriers and the two additional barriers are positioned concentrically around the first opening.

Other embodiments are possible as well, as described below.

BRIEF DESCRIPTION OF THE DRAWINGS

While the drawings are intended to illustrate some aspects and embodiments of the present disclosure, the drawings are merely schematic and are non-limiting. Aspects and embodiments not shown in the drawings are possible as well, as described herein.

DETAILED DESCRIPTION

Figure 1A:
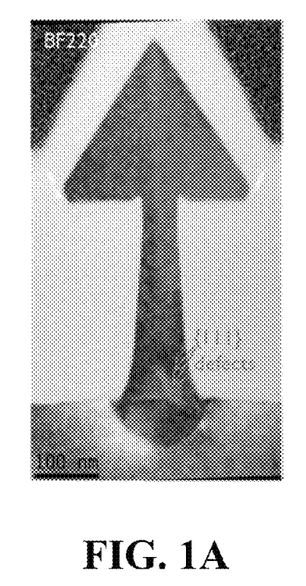
FIGS. 1A-B show cross-sectional Transmission Electron Microscopy (XTEM) photographs of a typical defect-trapping trench along a width (1A) and length (1B) of the trench.
Figure 1B:
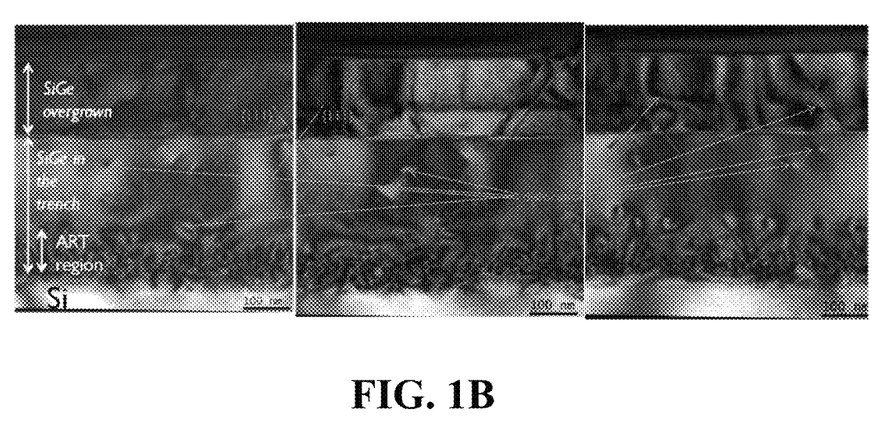

As noted above, the typical Aspect Ratio Trapping (ART) technique allows for the trapping of defects at the bottom of narrow oxide trenches using the sidewalls of the trenches. The typical ART technique is shown in FIGS. 1A-b. In particular, FIGS. 1A-B show cross-sectional Transmission Electron Microscopy (XTEM) photographs of a typical defect-trapping trench along a width (1A) and length (1B) of the trench.

FIGS. 1A-B illustrate that relaxed silicon germanium may be grown along narrow (e.g., 30 nm) widths of trenches on a silicon substrate using the typical ART technique. In particular, as shown in FIG. 1A, substantially all defects along the width of the trench (that is, substantially all 111 defects) at the silicon germanium-silicon interface may be trapped in the trench, leaving the top silicon germanium layer substantially defect-free along the width of the trench.

However, while such a typical ART technique may allow for defect-free silicon germanium along the width the trench, the typical ART technique fails to prevent defects in the silicon germanium along the length trench, as shown in FIG. 1B, due to the absence of trapping in this direction. In particular, FIG. 1B reveals a large number of defects along the length of the trench (even in the top part of the trench) that have not been trapped. Typical ART techniques are unable to prevent defects along the length of long trenches.

Thus, as shown, typical ART techniques work only for narrow and short trenches. However, as noted above, many applications including, for example, advanced logic complementary metal-oxide-semiconductor (CMOS) devices and photonics, longer trenches are required. For example, the minimum length of a trench for use in a CMOS transistor may be around 100 nm for the 14 nm technology node. Moreover, many CMOS devices employ at least one longer trench to connect the smaller trenches of each transistor, thereby increasing the density of the transistors in the CMOS device. These longer trenches may be on the order of, for example, a few microns. Accordingly, typical ART techniques are insufficient.

In order to grow substantially defect-free semiconductor material in longer trenches, defects should be trapped in all directions, along both the width and the length of the trenches. Disclosed are methods and mask structures for growing substantially defect-free semiconductor materials in longer trenches.

Figure 2:
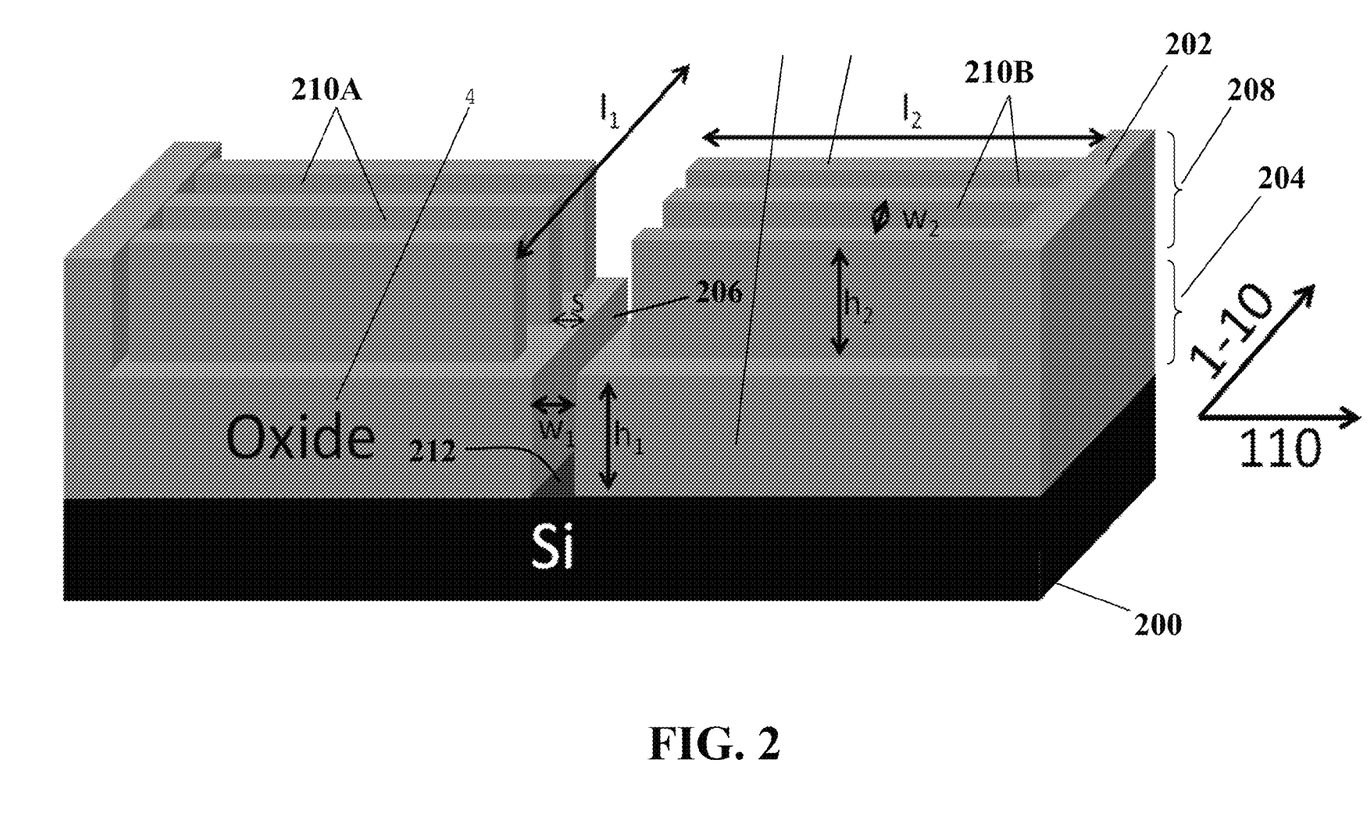
FIG. 2 is a schematic illustration of a mask structure having a first level comprising a first trench and a second level comprising two separate arrays of trenches separated by the first trench, in accordance with some embodiments.

In some embodiments, a mask structure 202 may include a first level 204 comprising a first trench 206 and a second level 208 comprising two arrays 210A, 210B of second trenches separated by the first trench 206, as schematically illustrated in FIG. 2.

As shown in FIG. 2, a substrate 200 may be comprised of a first crystalline material, such as silicon (as shown). Other first crystalline materials are possible as well. The substrate 200 may have a surface oriented along, for example, the (001) crystal plane.

The mask structure 202 may have a three-dimensional structure comprising a first level 204 and a second level 208. As shown, the first level 204 may comprise a first trench 206, the bottom 212 of which is formed by the substrate 200. Further, as shown, the second level 208 may comprise two arrays 210A, 210B of second trenches.

In some embodiments, the first trench 206 may have a width $w_1$ that is larger than a length $l_2$ of the second trenches in each of the arrays 210A, 210B. Further, in some embodiments, the first layer 204 of the mask structure 202 may have a height $h_1$ that, in some embodiments, may be substantially equal to a depth of the first trench 206.

In some embodiments, the first level 204 may comprise a dielectric layer, such as, for example, a silicon dioxide layer. Further, while only one first trench 206 is shown, in other embodiments, the first level 204 may include more than one first trench 206 arranged in, for example, an array. In these embodiments, the array of first trenches 206 may be less dense than the arrays 210A, 210B of second trenches in the second layer 208. In particular, each first trench 206 may be sufficiently separated from adjacent first trenches 206 in the array to allow an entire array (e.g., 210A or 210B) to be formed between the first trench 206 and each adjacent first trench 206. (That is, a pitch of the array of first trenches 206 may be greater than a length of each of the second trenches.) Other arrangements of first trenches 206 are possible as well.

In some embodiments, the second level 208 may similarly comprise a dielectric layer, such as, for example, a silicon dioxide layer. The second trenches in the arrays 210A, 210B may or may not extend through the entire second level 208.

As shown, the arrays 210A, 210B of second trenches are substantially orthogonal to the first trench 206. In particular, as shown in FIG. 2, the first trench 206 is oriented along the [110] direction, while the arrays 210A, 210B are oriented along the [1-10] direction. (Similarly, in embodiments where the first level 204 included an array of first trenches 206, the array of first trenches 206 could be oriented along the [110] direction, such that the array of first trenches 206 was substantially orthogonal to the arrays 210A, 210B of second trenches.) In other embodiments, the arrays 210A, 210B of second trenches may not be orthogonal to the first trench 206 (or array of first trenches 206), but rather may be offset from the first trench 206 (or array of first trenches 206) by another angle. In general, differing orientations of the arrays 210A, 210B of second trenches will result in differing crystalline orientations of semiconductor material laterally grown in the second trenches, as described below.

The mask structure 202 may, for example, be fabricated on the substrate 200 as follows. First, the first level 204 may be deposited on the substrate 200, and the first trench 206 may be etched in the first level 204. As shown, the first trench 206 may have a length $l_1$, a width $w_1$, and height $h_1$. The height $h_1$ of the first trench 206 may, for example, be at least three times the width $w_1$ of the first trench 206 (i.e., $h_1 \geq 3w_1$). This may allow for effective defect trapping in the first trench 206 when a semiconductor material is grown in the first trench 206.

Once the first trench 206 is etched, the second level 208 may be deposited on the first level 204, and the arrays 210A, 210B of second trenches may be etched in the second level 208. Each second trench may have a length $l_2$, a width $w_2$, and a height $h_2$. The height $h_2$ of each second trench may, for example, be at least three times the width $w_2$ of the second trench (i.e., $h_2 \geq 3w_2$). This may allow for effective defect trapping in the second trench when a semiconductor material is grown in the second trench. The values of $l_2$, $w_2$, and $h_2$ may be adapted for different applications. For example, for a Fin Field-Effect-Transistor (FinFET) device at and below 14 nm node, $l_2$ may be on the order of a few microns, $w_2$ may be about 10 nm, and $h_2$ may be about 300 nm. Other values and other applications are possible as well.

The first trench 206 may be separated from the edge of the arrays 210A, 210B by a spacing s, as shown. The spacing s may take values from, for example, 0 nm (or no spacing) up to a few tens of nanometers. Other spacings are possible as well. As shown in FIG. 2, the distance between the arrays 210A and 210B along 110 may be given by $2s+w_1$.

Figure 3A:
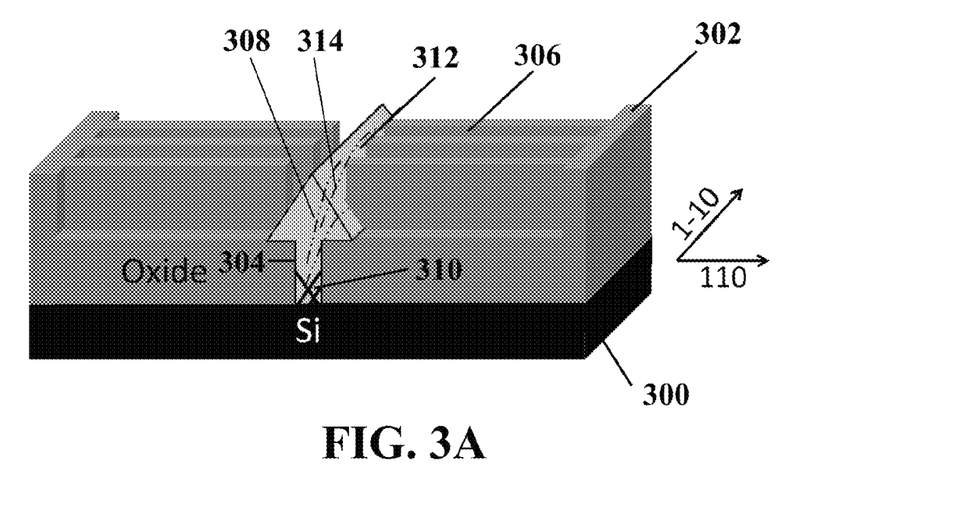
FIGS. 3A-E illustrate a method for forming a semiconductor material in a mask structure on a substrate, in accordance with some embodiments.

Once the mask structure 202 is formed on the substrate 200, a semiconductor material may be grown in the second trenches. FIGS. 3A-E illustrate a method for forming a semiconductor material in a mask structure on a substrate, in accordance with some embodiments. As shown in FIG. 3A, a mask structure 302 has been formed on a substrate 300.

The substrate 300 may comprise a first crystalline material, such as, for example, silicon having a (001) orientation. The first crystalline material may have a first lattice constant.

The mask structure 302 may take any of the forms described above for the mask structure 202 in FIG. 2. In particular, the mask structure 302 may include a first trench 304 in a first level and arrays of second trenches 306 in a second level, as shown.

To form the semiconductor material in the second trenches 306, the semiconductor may be epitaxially grown in the first trench 304, resulting in a growing layer 308 that overfills the first trench 304, as shown in FIG. 3A. The growing layer 308 may be grown in a manner similar to that used in, for example, typical ART techniques, as described above. The growing layer 308 may be grown in other manners as well.

The semiconductor material of the first growing layer 308 may comprise a second crystalline material different than the first crystalline material of the substrate 300. Moreover, the second crystalline material may have a second lattice constant that is different than the first lattice constant of the first crystalline material of the substrate 300.

As a result of the differing lattice constants, defects 310 may form along the width of the first trench 304 during the epitaxial growth of the semiconductor material. These defects 310 may be trapped in the first trench 304, as shown, as in typical ART techniques. However, 111 facets 312 and defects 314 may additionally form along the length of the first trench 304. As shown, the defects 314 along the length of the first trench 304 are not trapped in the first trench 304, but rather remain in the semiconductor material, as shown.

Figure 3B:
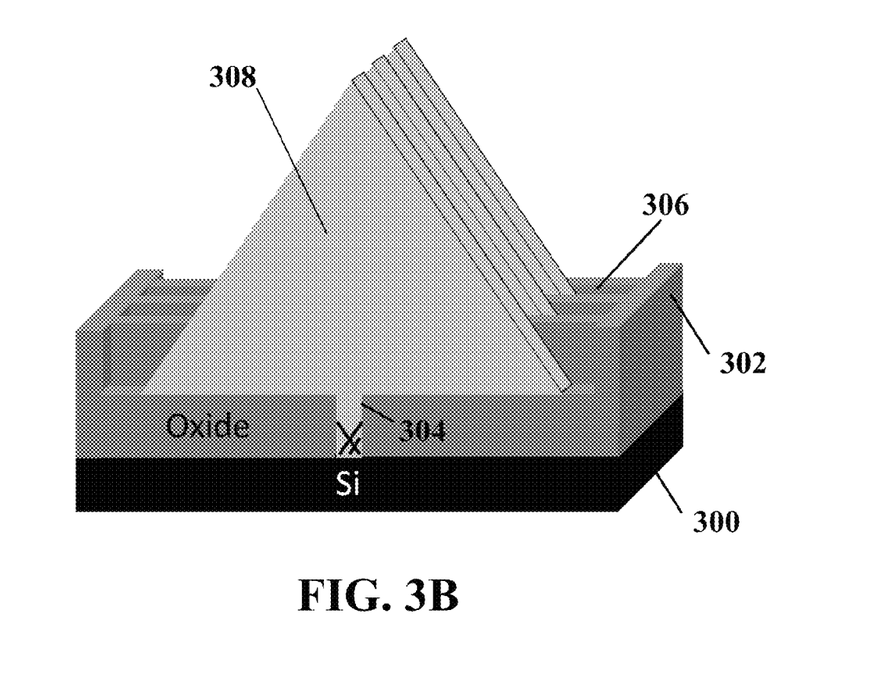
Figure 3C:
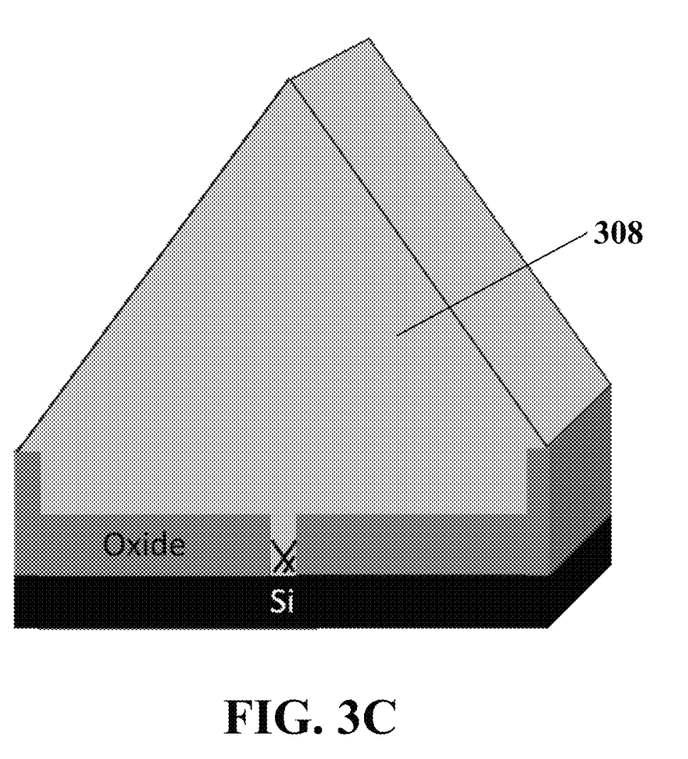

To address the defects 314 remaining in the semiconductor material, the disclosed method further comprises continuing epitaxial growth of the semiconductor material, thereby filling the second trenches 306 with the growing layer 308, as shown in FIG. 3B. In particular, the second trenches 306 may be laterally filled from the 111 planes by the semiconductor material. As a result of the additional growth, the defects 314 may be trapped in the second trenches 306 near the first trench 304. Following the additional growth, the second trenches 306 may be overfilled with the growing layer 308 of the semiconductor material, as shown in FIG. 3C.

Figure 3D:
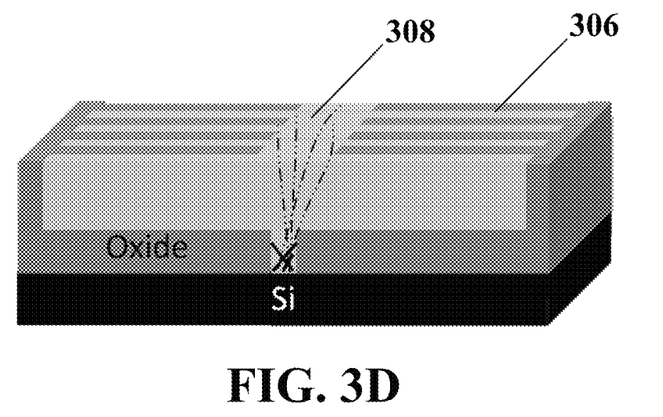

The growing layer 308 may then be planarized, as shown in FIG. 3D, using, for example, a chemical-mechanical polish (CMP) of the growing layer 308. Following the planarization, the second trenches 306 may be visible again.

Figure 3E:
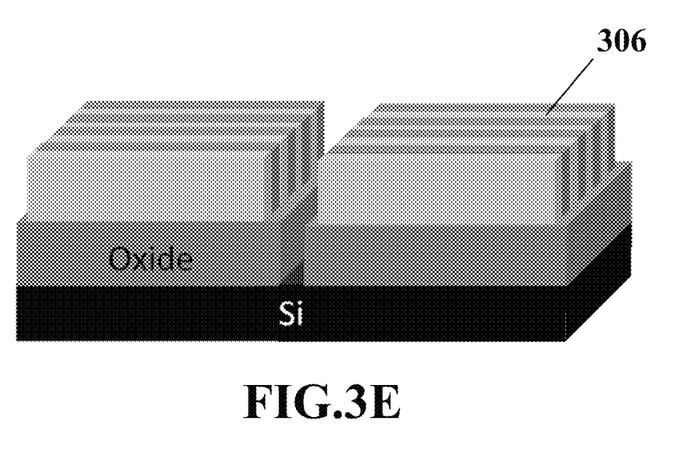

Thereafter, any remaining defects in the semiconductor material above the first trench 304 may be removed through, for example, a dry etch (e.g., with an additional masking step) of the growing layer 308. Following such a dry etch, the arrays of the second level of the mask structure 304 may be separated, as shown in FIG. 3E, and any remaining defects in the semiconductor material will be trapped in the second trenches 306. Thus, as a result of the defect trapping in both the first trench 304 and the second trenches 306, the semiconductor material may be substantially defect-free.

The mask structure may be fabricated using methods other than that described above in connection with FIG. 2. Example alternative methods for fabricating the mask structure as described below in connection with FIGS. 4A-D and 5A-E. Other methods are possible as well.

Figure 4A:
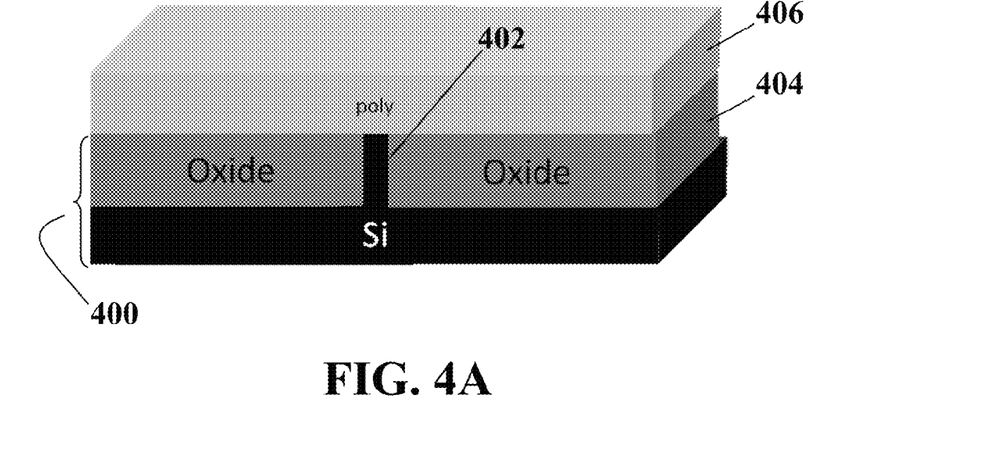
FIGS. 4A-D illustrate a method for fabricating a mask structure, in accordance with some embodiments.

FIGS. 4A-D illustrate a method for fabricating a mask structure, in accordance with some embodiments. As shown in FIG. 4A, the method may begin by providing a standard Shallow Trench Isolation (STI) wafer 400. The STI wafer 400 may, for example, comprise a silicon wafer. The silicon STI wafer 400 may have previously undergone a standard STI process, in which, through lithography and etching, first trenches were formed on the wafer (with silicon areas remaining between the trenches), the trenches were filled with oxide, and the surface was planarized (e.g., through CMP), resulting in a silicon area 402 separated by oxide areas 404, as shown in FIG. 4A. While only one silicon area 402 is shown, in some embodiments the STI wafer 400 may include more than one silicon area 402, with an oxide area 404 between adjacent silicon areas 402. In some embodiments, the silicon areas 402 may be narrow (e.g., $w_1 < h_1/3$) in order to improve the defect-trapping in the oxide areas 404.

The STI wafer 400 may serve as a substrate on which arrays of second trenches may be formed. To this end, a polysilicon layer 406 may be deposited on the STI wafer 400, as shown in FIG. 4A. In some embodiments, a pad oxide (e.g., a thin layer of thermal silicon oxide of chemical vapour deposition (CVD) oxide, not shown) may be deposited between the STI wafer 400 and the polysilicon layer 406. Such a pad oxide may serve to avoid detriment to the silicon area 402 when the polysilicon layer 406 is etched, as described below. However, in some embodiments, no pad oxide may be used.

Figure 4B:
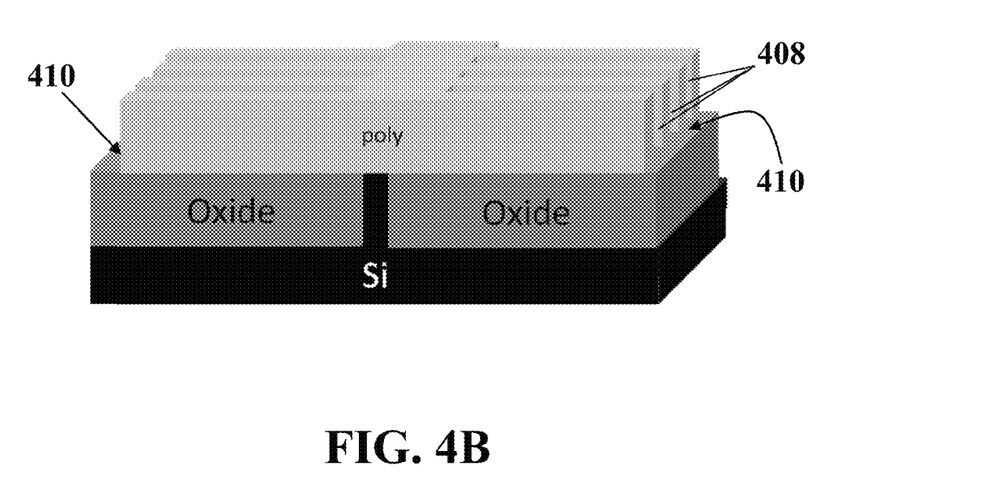

Thereafter, an array of intermediate trenches 408 may be formed in the polysilicon layer 406 through, for example, lithography and etching, as shown in FIG. 4B. Lateral areas 410 may exist on the outsides of the arrays of intermediate trenches 408, as shown in FIG. 4B.

Figure 4C:
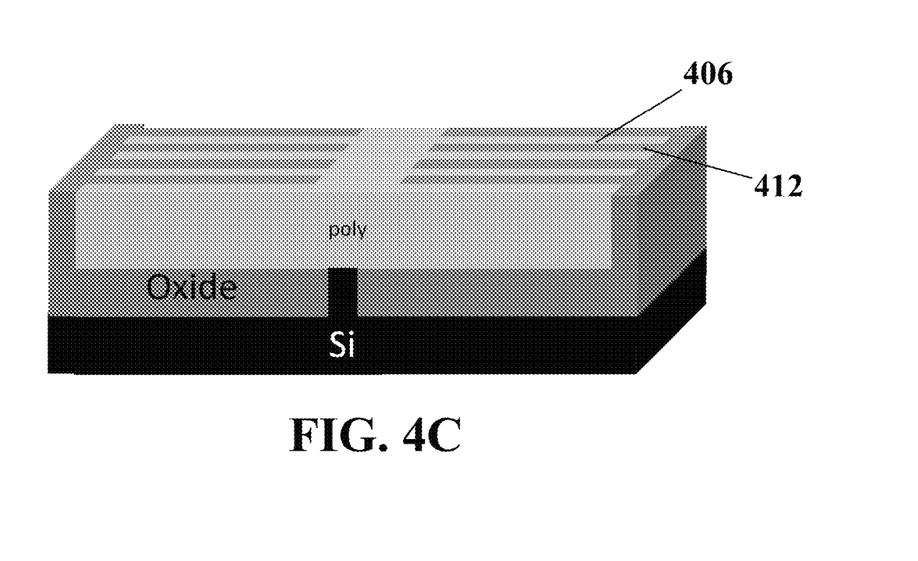

As shown in FIG. 4C, the intermediate trenches 408 may be filled with gap-fill silicon oxide 412 and then planarized using CMP. (As shown, the gap-fill silicon oxide 412 may also be deposited on the lateral areas 410.) In embodiments where the intermediate trenches 408 are very narrow, the gap-fill silicon oxide 412 may comprise, for example, a high-aspect-ratio-oxide (HARP) oxide (i.e., an oxide film deposited using an ozone/tetraethyl-orthosilicate ($O_3$/TEOS)-based sub-atmospheric CVD process), a reflowable oxide, or a high-density plasma (HDP) oxide. Other gap-fill oxides are possible as well.

Figure 4D:
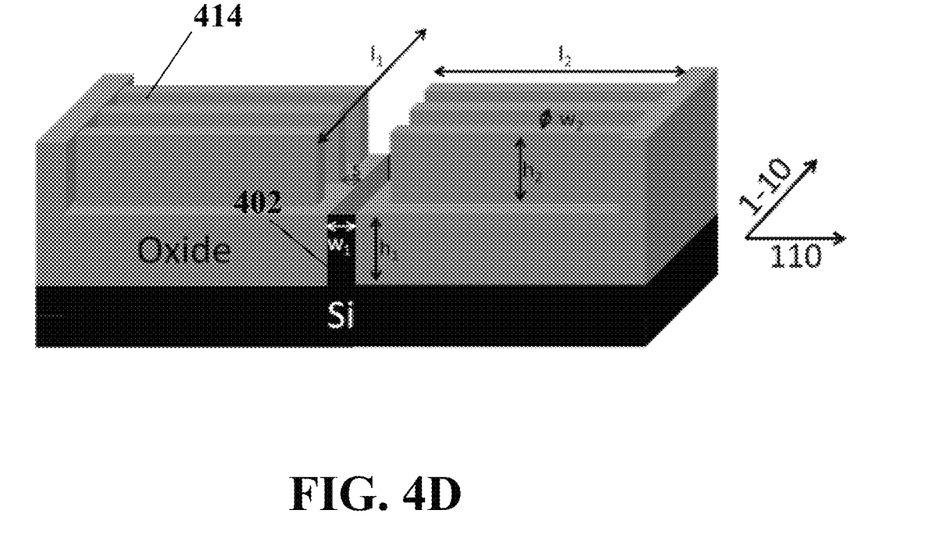

Following the filling of the intermediate trenches 408, the polysilicon layer 406 may be selectively removed, leaving behind the gap-fill silicon oxide 412. The remaining gap-fill silicon oxide 412 may form two arrays of second trenches 414, as shown in FIG. 4D. As shown, the second trenches 414 may be substantially orthogonal to the silicon area 402. While only one silicon area 402 is shown, in other embodiments, more than one silicon areas 402 may be arranged in, for example, an array. In these embodiments, the array of silicon areas 402 may be less dense than the arrays of second trenches 414. In particular, each silicon area 402 may be sufficiently separated from adjacent silicon areas 402 in the array to allow an entire array of second trenches 414 to be formed between the silicon area 402 and each adjacent silicon area 402. (That is, a pitch of the array of silicon areas 402 may be greater than a length of each of the second trenches 414.) Other configurations are possible as well.

The silicon area 402 may be recessed in-situ using, for example, HCl vapour. In some embodiments, the silicon area 402 may be recessed in the same epitaxial reactor where subsequent growth of semiconductor material takes place. The silicon area 402 may be recessed in other manners as well. In any case, the silicon area 402 may be recessed to thereby form a first trench, similar to the first trench 304 described above in connection with FIG. 3A. In embodiments where an array of silicon areas 402 is used, as described above, each of the silicon areas 402 may be recessed to form an array of first trenches, each of which is similar to the first trench 304 described above in connection with FIG. 3A. Other configurations are possible as well.

In some embodiments, rather than using the STI wafer 400 and the polysilicon layer 406, a dielectric stack comprising a first dielectric layer and a second dielectric layer may be formed on a blanket substrate. The first and second dielectric layers may have different removal (e.g., dry etch) rates, but may have the same epitaxial grown compatibility of the semiconductor material to be epitaxially grown. Alternatively, the first and second dielectric layers may comprise the same dielectric material.

In these embodiments, the first trench and the second trenches 414, as described above, may be patterned in the dielectric stack. In some embodiments, an etch-stop layer may be provided between the first and second dielectric layers to control the patterning process. The etch-stop layer may, for example, have the same epitaxial grown compatibility of the semiconductor material to be epitaxially grown as do the first and second dielectric layers, in order to avoid or reduce the occurrence of defects in the semiconductor material.

Alternatively, in these embodiments, the first trench and the second trenches 414, as described above, may be patterned in the dielectric stack using a timed-etch removal. In some embodiments, such a timed-etch removal may allow for better integration and/or fin height, regardless of the gap fill.

Figure 5A:
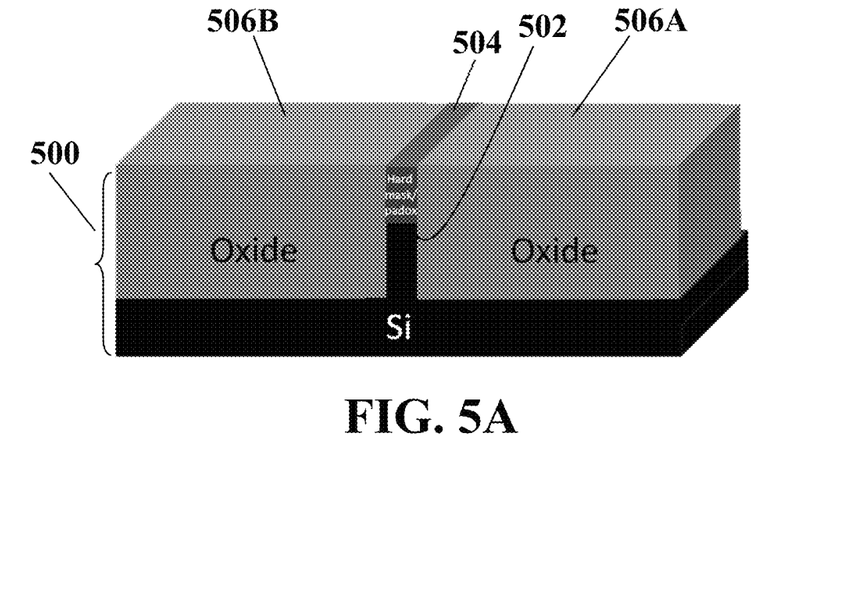
FIGS. 5A-C illustrate another method for fabricating a mask structure, in accordance with some embodiments.

Another method for fabricating the mask structure is illustrated in FIGS. 5A-C. As shown in FIG. 5A, in some embodiments the mask structure may be fabricated using an STI wafer 500 that has not undergone a complete standard STI process, as described above. Rather, the STI wafer 500 may comprise a stack of a silicon substrate (including a silicon area 502), a silicon nitride hard mask and pad oxide 504, and STI oxide regions 506A, 506B. As shown, the silicon nitride hard mask and pad oxide 504 may separate the STI oxide regions 506A, 506B. While only one silicon area 502 is shown, in other embodiments, more than one silicon areas 502 may be arranged in, for example, an array.

Figure 5B:
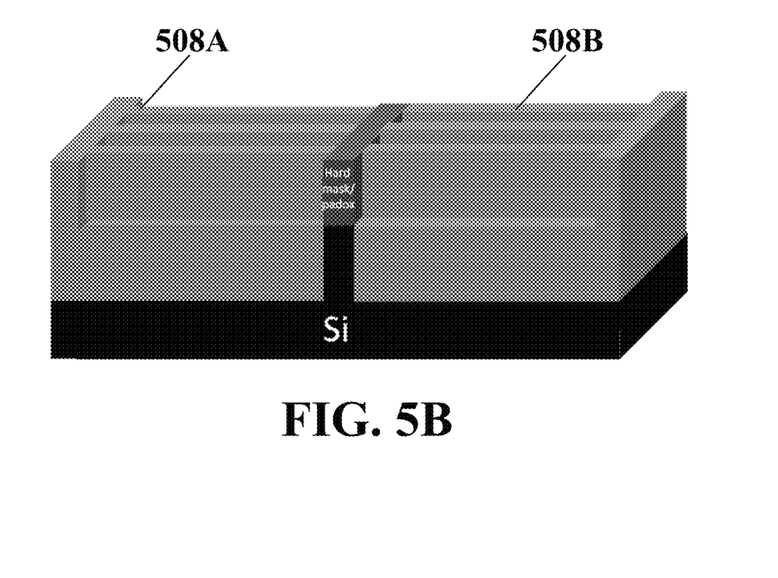

As shown in FIG. 5B, arrays 508A, 508B of second trenches may be formed in the STI oxide regions 506A, 506B using, for example, lithography and selective etching (e.g., selective to the nitride hard mask). In some embodiments, the arrays 508A, 508B of second trenches may be patterned using a soft hard mask (not shown) comprising, for example, an amorphous carbon material, such as APF™. Other soft hard masks are possible as well.

In embodiments where the silicon area 502 comprises an array of silicon areas 502, the array of silicon areas 502 may be less dense than the arrays 508A, 508B of second trenches. In particular, each silicon area 502 may be sufficiently separated from adjacent silicon areas 502 in the array to allow an entire array 508A or 508B of second trenches to be formed between the silicon area 502 and each adjacent silicon area 502. (That is, a pitch of the array of silicon areas 502 may be greater than a length of each of the second trenches in the arrays 508A, 508B.) Other configurations are possible as well.

Figure 5C:
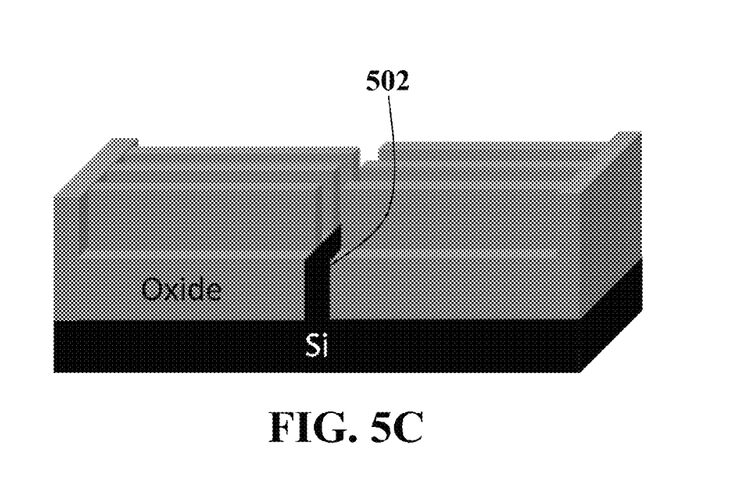

Thereafter, the silicon nitride hard mask and pad oxide 504 may be removed, as shown in FIG. 5C. The silicon area 502 may be recessed in-situ using, for example, HCl vapour. In some embodiments, the silicon area 502 may be recessed in the same epitaxial reactor where subsequent growth of semiconductor material takes place. The silicon area 502 may be recessed in other manners as well. In any case, by recessing the silicon area 502 a first trench may be formed. The first trench may be similar to the first trench 304 described above in connection with FIG. 3A. The first trench may be substantially orthogonal to the second trenches, as shown. Other configurations are possible as well. In embodiments where an array of silicon areas 502 is used, as described above, each of the silicon areas 502 may be recessed to form an array of first trenches, each of which is similar to the first trench 304 described above in connection with FIG. 3A. Other configurations are possible as well.

While the foregoing has described three methods for fabricating the mask structure, alternative methods for fabricating the mask structure are possible as well, including any combination of the disclosed methods.

Additionally, alternative mask structures suitable for the disclosed methods are possible as well. Example alternative mask structures are described below in connection with FIGS. 6, 7, and 8A. Other alternative mask structures are possible as well.

Figure 6:
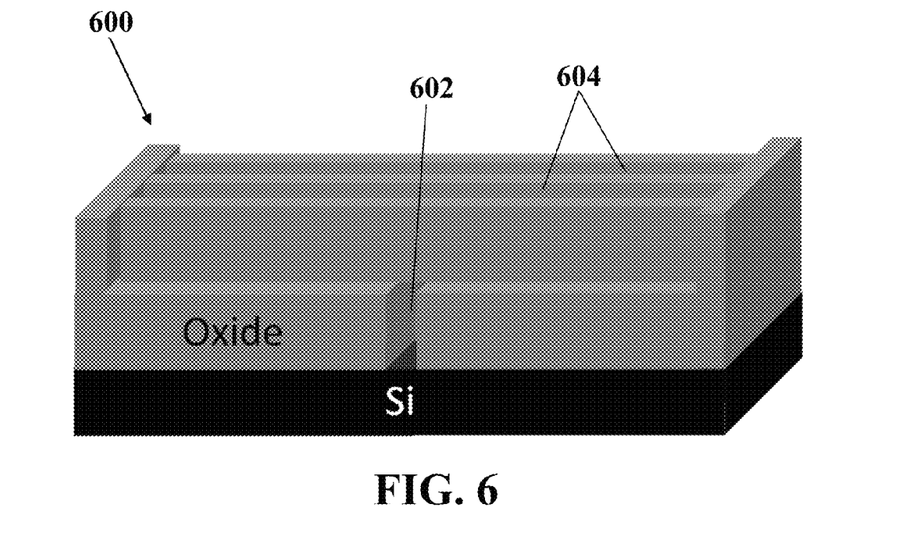
FIG. 6 is a schematic illustration of a mask structure having continuous second trenches, in accordance with some embodiments.

FIG. 6 is a schematic illustration of a mask structure having continuous second trenches, in accordance with some embodiments. As shown in FIG. 6, the mask structure 600 may, in some embodiments, comprise second trenches 604 that extend continuously over the first trench 602 (rather than comprising two arrays of second trenches separated by the first trench, as described above in connection with FIG. 2).

Figure 7:
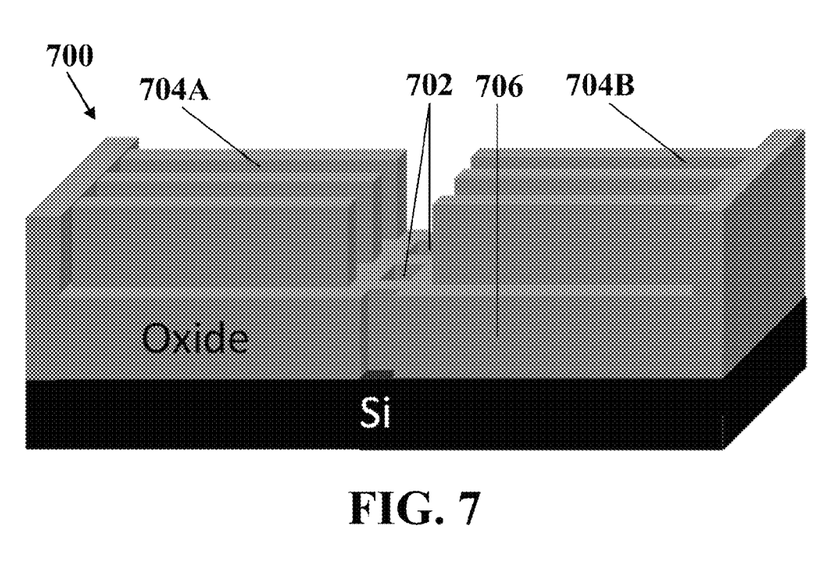
FIG. 7 is a schematic illustration of a mask structure having two separate arrays of second trenches separated by vias, in accordance with some embodiments.

FIG. 7 is a schematic illustration of a mask structure having two separate arrays of trenches separated by vias, in accordance with some embodiments. As shown in FIG. 7, the first trench 304 describe above in connection with FIG. 3A may be replaced with one or more vias 702 in the mask structure 700, as shown. While the vias 702 are referred to as "vias," other openings are possible as well, including, for example, openings with polygonal or substantially circular cross-sections. Other openings are possible as well. The vias 702 may extend through the complete thickness of the first level 706 of the mask structure 700, as shown. Growth of the semiconductor material may take place in the vias 702, similar to how the growth of the semiconductor material took place in the first trench 304, as described above in connection with FIG. 3A.

As shown, the arrays 704A, 704B of second trenches may be separated by the vias 702. While the arrays 704A, 704B of second trenches are shown to be substantially orthogonal to the vias 702, in other embodiments the arrays 704A, 704B of second trenches may be offset from the vias 702 by another non-zero angle.

Figure 8A:
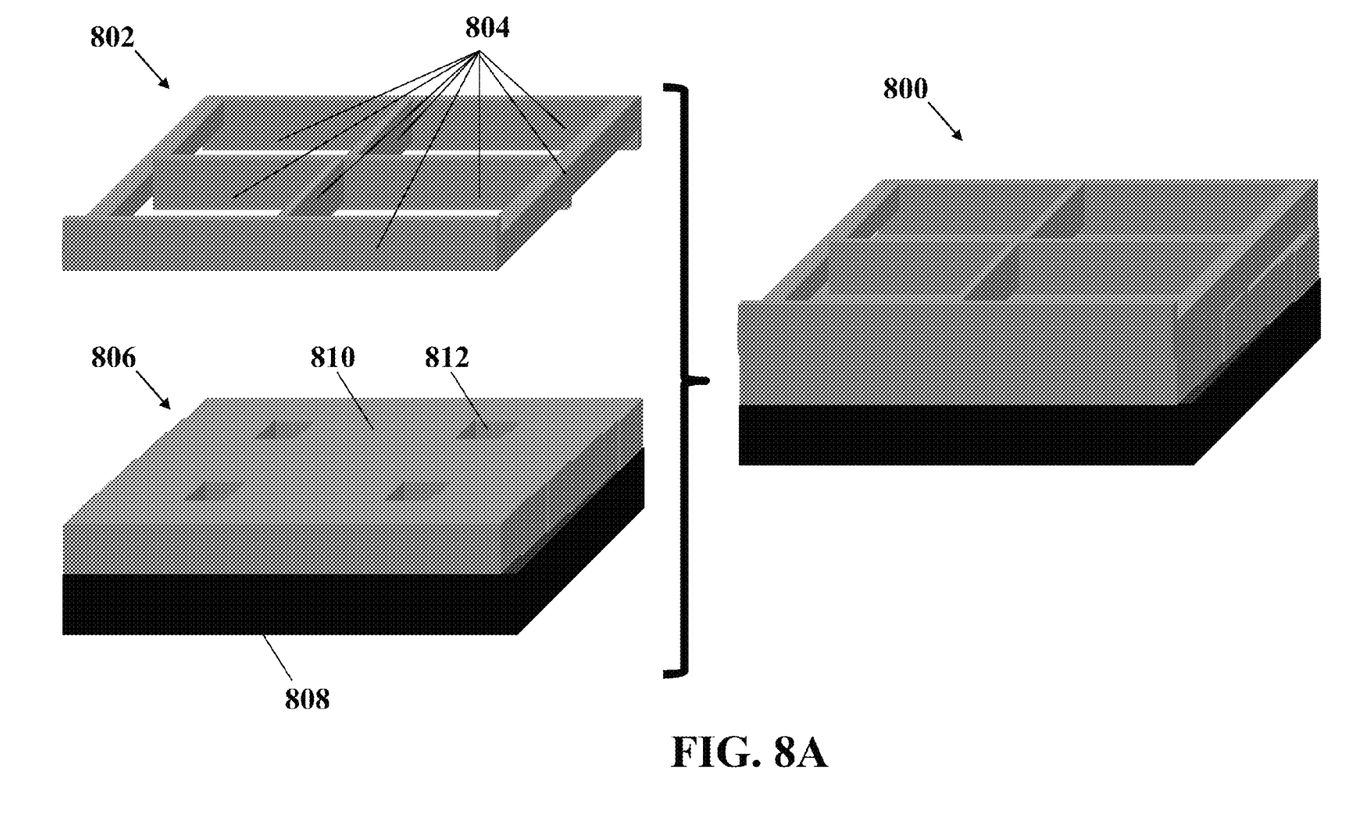
FIGS. 8A-B show a schematic illustration of a mask structure (8A) having a first level comprising a plurality of openings and a second level comprising barriers to be aligned around the plurality of openings and a method (8B) of using the mask structure shown in FIG. 8A.

FIG. 8A shows a schematic illustration of yet another mask structure. As shown in FIG. 8A, the mask structure 800 may have a first level 802 comprising a plurality of openings 804, and a second level 806 comprising barriers 810 to be aligned to the plurality of openings 804.

The first level 802 may comprise, for example, a dielectric layer, such as a silicon oxide layer. As shown, the first level 802 includes a plurality of openings 804 that extend through the thickness of the first level 802.

The second level 806 comprises a substrate 808 of a first crystalline material, such as silicon, having a first lattice constant. The second level 806 further comprises barriers 810. As shown, the barriers 810 comprise square-shaped barriers, each of which is positioned concentrically around a hole 812. Other shapes and positions of the barriers 810 and the holes 812 are possible as well.

Each of the first level 802 and the second level 806 of the mask structure 800 may be produced using any of the methods described above (including, for example, patterning a polysilicon layer, as described above in connection with FIGS. 4A-D.) Other methods of fabricating the mask structure are possible as well.

Figure 8B:
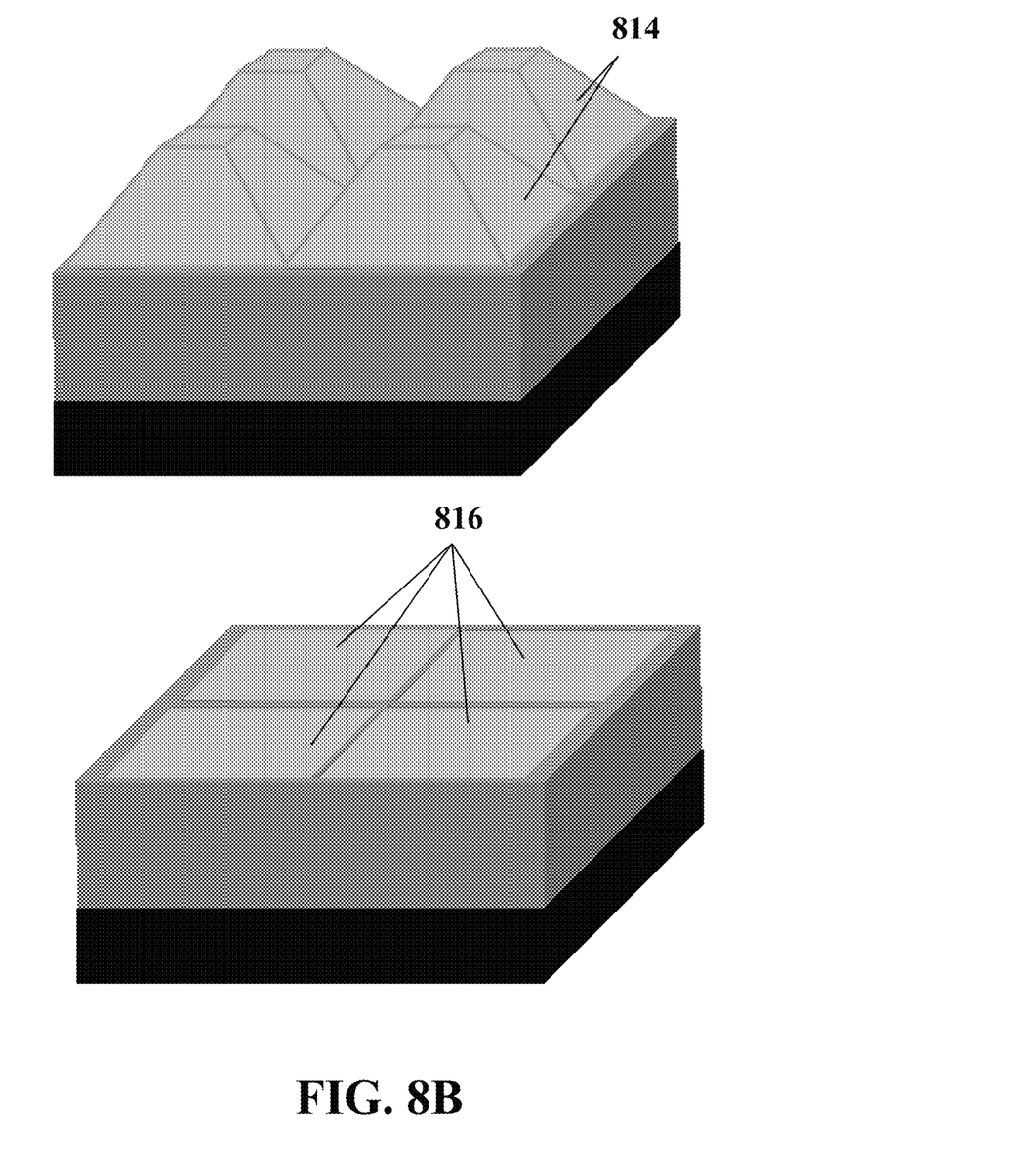

FIG. 8*b* illustrates use of the mask structure 800 in the epitaxial growth of a semiconductor material. The semiconductor material may be, for example, a second crystalline material having a second lattice constant. The second crystalline material may be different than the first crystalline material, and the second lattice constant may be different than the first lattice constant, such that there is a lattice mismatch between the substrate 808 and the semiconductor material. The depth and cross-section of the holes 812 may be selected to trap defects arising in the semiconductor material during the epitaxial growth, such that an overgrowth 814 of the semiconductor material is substantially defect-free. Further, the barriers 810 may serve to prevent defects during the merging of the semiconductor material epitaxially grown in adjacent holes 812.

The epitaxial growth of the semiconductor material may continue until the semiconductor material covers at least a portion of the height of the barriers 810. In some embodiments, the epitaxial growth may continue until the overgrowth 814 extends above the barriers 810, as shown in FIG. 8B. In these embodiments, the overgrowth 814 may be planarized using, for example, a CMP, as shown in FIG. 8B. As a result of the planarizing, all semiconductor material above the barriers 810 may be removed. The planarized semiconductor material 816 may be substantially defect-free.

In some embodiments, the disclosed mask structures and methods may be used in the fabrication of, for example, high-quality epitaxially-grown semiconductor materials in narrow trenches for use in, for example, FinFET or photonic devices.

Further, in some embodiments the semiconductor material may comprise, for example, group IV semiconductor materials or alloys (such as, for example, silicon, germanium, and silicon germanium) or group III-V compounds, including, for example, binary or tertiary III-V compounds (such as, for example, gallium arsenide, indium phosphide, indium gallium arsenide, indium antimonide, or combinations or mixtures thereof). Other semiconductor materials are possible as well.

In some embodiments, the mask structure may comprise barriers, such as those shown in FIG. 3C. The barriers may serve to inhibit growth of the semiconductor material in a horizontal direction, as shown in FIG. 3C. In embodiments where the first trench comprises an array of first trenches, the barriers may serve to prevent semiconductor material being grown in adjacent first trenches from merging with one another and producing defects.

As shown in FIGS. 4A-D, the barriers may be produced along with the arrays of second trenches. To this end, the polysilicon layer may be patterned without barriers, as shown in FIG. 4B. That is, in addition to removing areas of the polysilicon layer orthogonal to the first trench to form the second trenches, lateral areas of the polysilicon layer parallel to the first trench may be patterned as well, as shown in FIG. 4B. As a result, when the gap-fill silicon oxide is deposited, as shown in FIG. 4C, the barriers may be formed of the gap-fill silicon oxide. While the barriers are shown only on two sides of the mask structure, in other embodiments the barriers may be on more or fewer sides of the mask structure (for example, the barriers may be on all four sides of the mask structure). Once the semiconductor material is grown, the barriers may be removed by, for example, a CMP, as shown in FIG. 3E.

In some embodiments, no barriers may be used. In these embodiments, substantially defect-free semiconductor material may still be grown. Should any semiconductor material merge between adjacent trenches or vias, as described above, the merged area may be removed in a manner similar to the removal of the barriers shown in FIG. 3E.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Further, while the foregoing description details certain embodiments of the disclosure, it will be appreciated that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

Unless specified, the description of a layer being deposited or produced 'on' another layer or substrate, includes the options of, for example, the layer being produced or deposited directly on (that is, in contact with) the other layer or substrate, and the layer being produced on one or a stack of intermediate layers between the layer and the other layer or substrate.

The invention claimed is:

1. A method comprising:
providing a substrate comprising a first crystalline material, wherein the first crystalline material has a first lattice constant;
providing a mask structure on the substrate, wherein the mask structure comprises:
a first level defining a first trench extending through the first level, wherein a bottom of the first trench is defined by the substrate, and
a second level on top of the first level, wherein the second level defines a plurality of second trenches positioned at a non-zero angle with respect to the first trench, wherein the second level defines a first array of second trenches and a second array of second trenches, and wherein the first array of second trenches is discontinuous from the second array of second trenches and is separated by the first trench; and
after providing the mask structure defining the first trench and the plurality of second trenches, epitaxially growing a second crystalline material from the substrate defining the bottom of the first trench until the second crystalline material covers at least a portion of the plurality of second trenches, wherein:
the second crystalline material has a second lattice constant different than the first lattice constant, and
epitaxially growing the second crystalline material on the bottom of the first trench comprises trapping defects in the second crystalline material in at least one direction in the first trench.

2. The method of claim 1, wherein the non-zero angle comprises substantially 90°.

3. The method of claim 1, wherein the first trench comprises a plurality of first trenches.

4. The method of claim 1, wherein epitaxially growing the second crystalline material until the second crystalline material covers at least a portion of the plurality of second trenches comprises growing the second crystalline material until the second crystalline material overgrows the plurality of second trenches.

5. The method of claim 4, further comprising planarizing the second crystalline material.

6. The method of claim 1, wherein the at least one direction in the first trench comprises a direction along a length of the first trench.

7. The method of claim 1, wherein each of the first crystalline material and the second crystalline material comprises a semiconductor material.

8. A method comprising:
providing a substrate comprising a first crystalline material, wherein the first crystalline material has a first lattice constant;
providing a mask structure on the substrate, wherein the mask structure comprises:
a first level defining a first trench extending through the first level, wherein a bottom of the first trench is defined by the substrate, and
a second level on top of the first level, wherein the second level comprises two barriers positioned on opposite sides of the first trench, wherein the second level further defines a plurality of second trenches positioned at a non-zero angle with respect to the first trench, wherein an end of each second trench of the plurality of second trenches is further defined by a barrier of the two barriers, wherein the plurality of second trenches includes a first array of second trenches and a second array of second trenches, and wherein the first array of second trenches is discontinuous from the second array of second trenches and is separated by the first trench; and
after providing the mask structure comprising the first level and the second level, epitaxially growing a second crystalline material from the substrate defining the bottom of the first trench until the second crystalline material covers at least a portion of the two barriers, wherein:
the second crystalline material has a second lattice constant different than the first lattice constant, and
epitaxially growing the second crystalline material on the bottom of the first trench comprises trapping defects in the second crystalline material in at least one direction in the first trench.

9. The method of claim 8, wherein:
the first level further defines an array of first trenches including the first trench; and
the second level further comprises an array of barriers including the two barriers, wherein barriers in the array of barriers are positioned on opposite sides of first trenches in the array of first trenches.

10. The method of claim 9, wherein epitaxially growing the second crystalline material until the second crystalline material covers at least a portion of the two barriers comprises growing the second crystalline material until the second crystalline material overgrows the two barriers.

11. The method of claim 10, further comprising planarizing the second crystalline material.

12. The method of claim 1, wherein each of the second trenches has a height that is at least three times a width of the respective second trench.

13. The method of claim 1, wherein each second trench of the first array of second trenches and the second array of second trenches comprises an edge that is adjacent to the first trench, and wherein each respective edge is separated from the first trench by a non-zero spacing.

14. The method of claim 8, wherein epitaxially growing the second crystalline material includes growing the second crystalline material until the second crystalline material covers at least a portion of the plurality of second trenches.

15. The method of claim 14, wherein each of the second trenches has a height that is at least three times a width of the respective second trench.

16. The method of claim 8, wherein each second trench of the first array of second trenches and the second array of second trenches comprises an edge that is adjacent to the first trench, and wherein each respective edge is separated from the first trench by a non-zero spacing.

* * * * *